United States Patent
Harms et al.

(10) Patent No.: US 9,537,088 B1
(45) Date of Patent: Jan. 3, 2017

(54) MAGNETIC TUNNEL JUNCTIONS

(71) Applicant: Micron Technology, Inc., Boise, ID (US)

(72) Inventors: Jonathan D. Harms, Boise, ID (US); Wei Chen, White Plains, NY (US); Sunil S. Murthy, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/797,622

(22) Filed: Jul. 13, 2015

(51) Int. Cl.
| | |
|---|---|
| *H01L 29/82* | (2006.01) |
| *H01L 21/02* | (2006.01) |
| *H01L 29/66* | (2006.01) |
| *H01L 21/00* | (2006.01) |
| *H01L 43/10* | (2006.01) |
| *H01L 43/02* | (2006.01) |
| *H01L 43/08* | (2006.01) |
| *G11C 11/16* | (2006.01) |

(52) U.S. Cl.
CPC ............ *H01L 43/10* (2013.01); *G11C 11/161* (2013.01); *H01L 43/02* (2013.01); *H01L 43/08* (2013.01)

(58) Field of Classification Search
CPC .......... H01L 43/02; H01L 43/08; H01L 43/10; G11C 11/161
USPC ......... 257/421, E29.323, 295, 327; 365/158; 438/3
See application file for complete search history.

(56) References Cited

U.S. PATENT DOCUMENTS

| | | | |
|---|---|---|---|
| 8,750,029 B2 | 6/2014 | Kitagawa et al. | |
| 9,312,474 B2 | 4/2016 | Kim et al. | |
| 2007/0064352 A1* | 3/2007 | Gill | B82Y 25/00 360/324.11 |
| 2007/0243638 A1* | 10/2007 | Horng | H01L 43/10 438/3 |
| 2008/0023740 A1* | 1/2008 | Horng | B82Y 25/00 257/295 |
| 2009/0079018 A1* | 3/2009 | Nagase | B82Y 25/00 257/421 |

(Continued)

FOREIGN PATENT DOCUMENTS

| | | |
|---|---|---|
| JP | 2012-064905 | 3/2012 |
| KR | 10-2014-0122074 | 10/2014 |
| WO | PCT/US2016/041449 | 10/2016 |

OTHER PUBLICATIONS

U.S. Appl. No. 14/563,303, filed Dec. 8, 2014 by Chen et al.

*Primary Examiner* — Dzung Tran
(74) *Attorney, Agent, or Firm* — Wells St. John P.S.

(57) ABSTRACT

Some embodiments include a magnetic tunnel junction comprising magnetic reference material having an iridium-containing region between a multi-layer stack and a polarizer region. Some embodiments include a magnetic tunnel junction having a conductive first magnetic electrode which contains magnetic recording material, a conductive second magnetic electrode spaced from the first electrode and which contains magnetic reference material, and a non-magnetic insulator material between the first and second electrodes. The magnetic reference material of the second electrode includes a first region containing a stack of cobalt alternating with one or more of platinum, palladium and nickel; includes an iridium-containing second region over the first region; and includes a cobalt-containing third region over the second region. The third region is directly against the non-magnetic insulator material.

13 Claims, 2 Drawing Sheets

(56) References Cited

U.S. PATENT DOCUMENTS

| | | | |
|---|---|---|---|
| 2009/0256220 A1* | 10/2009 | Horng | H01L 43/08 257/421 |
| 2010/0096716 A1 | 4/2010 | Ranjan et al. | |
| 2012/0146167 A1* | 6/2012 | Huai | H01L 43/08 257/421 |
| 2013/0148418 A1 | 6/2013 | Luo et al. | |
| 2013/0236639 A1* | 9/2013 | Carey | G11B 5/3163 427/130 |
| 2013/0241014 A1* | 9/2013 | Katti | G06F 21/86 257/421 |
| 2015/0171315 A1 | 6/2015 | Gan et al. | |

\* cited by examiner

MAGNETIC TUNNEL JUNCTIONS

TECHNICAL FIELD

Magnetic tunnel junctions.

BACKGROUND

A magnetic tunnel junction is an integrated circuit component having two conductive magnetic electrodes separated by a thin non-magnetic tunnel insulator material (e.g., dielectric material). The insulator material is sufficiently thin such that electrons can tunnel from one magnetic electrode to the other through the insulator material under appropriate conditions. At least one of the magnetic electrodes can have its overall magnetization direction switched between two states at a normal operating write or erase current/voltage, and is commonly referred to as the "free" or "recording" electrode. The other magnetic electrode is commonly referred to as the "reference", "fixed", or "pinned" electrode, and whose overall magnetization direction will not switch upon application of the normal operating write or erase current/voltage. The reference electrode and the recording electrode are electrically coupled to respective conductive nodes. Electrical resistance between those two nodes through the reference electrode, insulator material, and the recording electrode is dependent upon the magnetization direction of the recording electrode relative to that of the reference electrode. Accordingly, a magnetic tunnel junction can be programmed into one of at least two states, and those states can be sensed by measuring current flow through the magnetic tunnel junction. Since magnetic tunnel junctions can be "programmed" between two current-conducting states, they have been proposed for use in memory integrated circuitry. Additionally, magnetic tunnel junctions may be used in logic, sensors, oscillators or other circuitry apart from or in addition to memory.

The overall magnetization direction of the recording electrode can be switched by a current-induced external magnetic field or by using a spin-polarized current to result in a spin-transfer torque (STT) effect. Charge carriers (such as electrons) have a property known as "spin" which is a small quantity of angular momentum intrinsic to the carrier. An electric current is generally unpolarized (having about 50% "spin-up" and about 50% "spin-down" electrons). A spin-polarized current is one with significantly more electrons of either spin. By passing a current through certain magnetic material (sometimes also referred to as polarizer material), one can produce a spin-polarized current. If a spin-polarized current is directed into a magnetic material, spin angular momentum can be transferred to that material, thereby affecting its magnetization orientation. This can be used to excite oscillations or even flip (i.e., switch) the orientation/domain direction of the magnetic material if the spin-polarized current is of sufficient magnitude.

An alloy or other mixture of Co and Fe is one common material proposed for use as a polarizer material and/or as at least part of the magnetic recording material of a recording electrode in a magnetic tunnel junction. A more specific example is $Co_xFe_yB_z$ where x and y are each 10-80 and z is 0-50, and may be abbreviated as CoFe or CoFeB. MgO is a suitable material for the non-magnetic tunnel insulator.

Tunnel insulator materials are often crystalline, and are desired to have a body-centered-cubic (bcc) 001 lattice.

Tunnel insulator and polarizer materials may be deposited using any suitable methodology (e.g., physical vapor deposition). One technique usable to ultimately produce the bcc 001 lattice in both tunnel insulator and adjacent polarizer material includes initially forming cobalt-and-iron-containing material of the polarizer to be amorphous and upon which tunnel insulator material (e.g., MgO) is deposited. During and/or after the depositing, the cobalt-and-iron-containing material and the tunnel insulator may each achieve a uniform bcc 001 lattice structure.

DETAILED DESCRIPTION OF THE ILLUSTRATED EMBODIMENTS

Magnetic tunnel junctions may be utilized in spin-torque-transfer magnetic random access memory (STT-MRAM). In such applications, it can be desired that a magnetic tunnel junction have strong magnetic coupling across various regions of the magnetic reference material (i.e., pinned magnetic material) in order to maintain a desired magnetic orientation (i.e., to achieve pinned spin-orientation stability). In particular embodiments, an iridium-containing region is provided between a polarizer region and other magnetic regions of a reference material. The iridium-containing region may enable improved magnetic coupling of the polarizer region to the other magnetic regions, and may also enable perpendicular magnetic anisotropy along interfaces of iridium-containing material with the adjacent magnetic materials. The magnetic coupling through the iridium-containing region may be antiferromagnetic or ferromagnetic, depending on the thickness of the iridium-containing region. In some embodiments, the magnetic coupling through the iridium-containing region is stable to at least about 7 kilo-Oersteds (kOe).

Example embodiments are described with reference to FIGS. 1 and 2.

Figure 1:
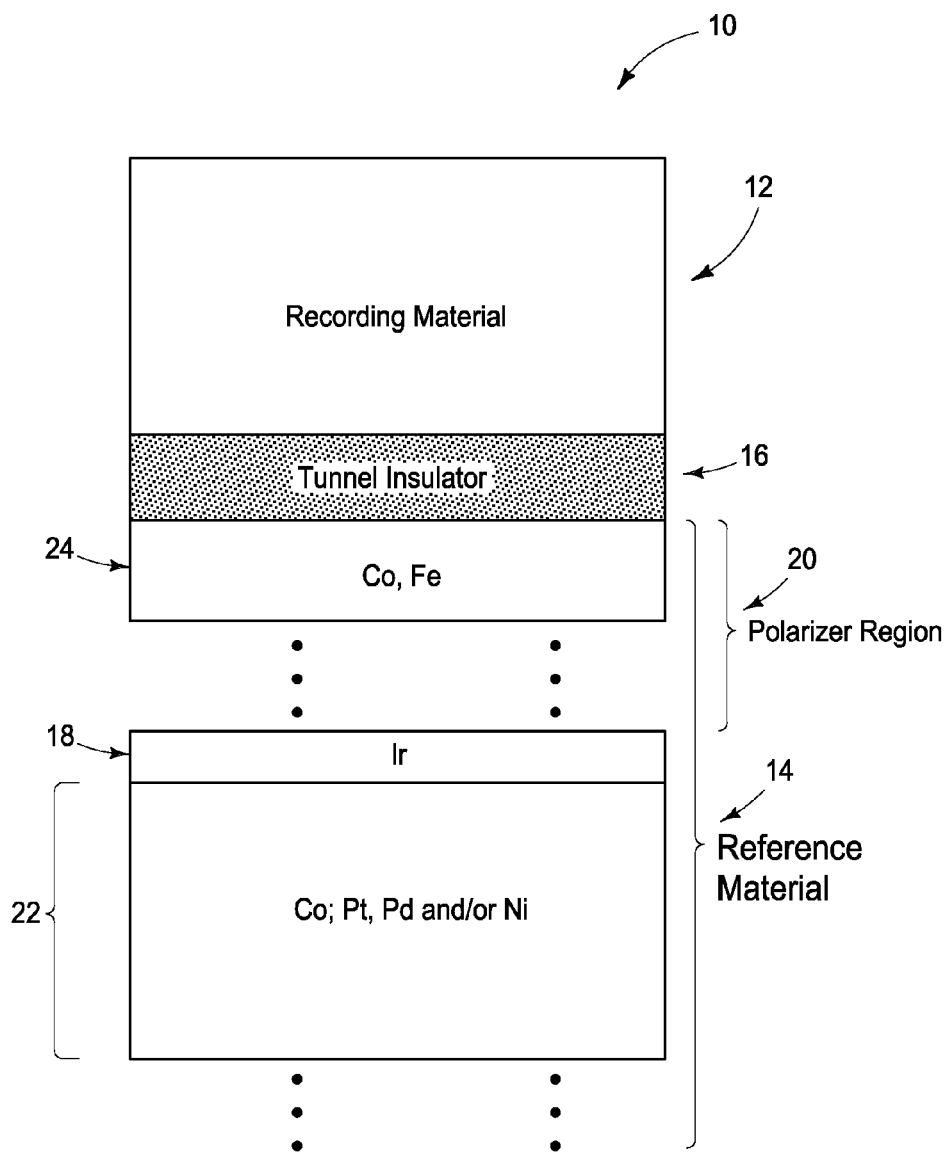
FIGS. 1 and 2 are diagrammatic, cross-sectional views of example embodiment magnetic tunnel junctions

Referring to FIG. 1, a magnetic tunnel junction 10 comprises an electrically conductive first magnetic (i.e., ferrimagnetic or ferromagnetic) electrode 12 comprising magnetic recording material. An electrically conductive second magnetic electrode 14 is spaced from the first electrode 12 and comprises magnetic reference material. Accordingly, the first electrode 12 may function as a recording (i.e., free) electrode, and the second electrode 14 may function as a reference (i.e., pinned) electrode.

A nonmagnetic tunnel insulator material 16 is between the first and second electrodes 12 and 14.

Unless otherwise indicated, any of the materials and/or structures described herein may be homogeneous or nonhomogeneous, and regardless may be continuous or discontinuous over any material which such overlie. Further, unless otherwise stated, each material may be formed using any suitable existing or yet-to-be-developed technique, with atomic layer deposition, chemical vapor deposition, physical vapor deposition, epitaxial growth, diffusion doping, and ion implanting being examples. The magnetic recording material and the magnetic reference material are individually overall and collectively magnetic, even though one or both may have one or more regions therein which are intrinsically nonmagnetic.

The magnetic tunnel junction 10 may be supported by a semiconductor base (not shown). Such base may, for example, comprise semiconductor material, and in some embodiments may comprise, consist essentially of, or consist of monocrystalline silicon. In some embodiments, the semiconductor base may be considered to be a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, the semiconductor substrate may contain one or more materials associated with integrated circuit fabrication. Some of the materials may correspond to, for example, one or more of refractory metal materials, barrier materials, diffusion materials, insulator materials, etc.

The positions of first electrode 12 and second electrode 14 may be reversed. Further, although magnetic tunnel junction 10 is shown as being generally vertically or elevationally oriented in FIG. 1, other orientations may be used. Such other orientations may include, for example, horizontal, diagonal, one or more combinations of horizontal, vertical, diagonal, etc. In this document, "horizontal" refers to a general direction along a primary surface relative to which the substrate is processed during fabrication, and "vertical" is a direction generally orthogonal thereto. Further, "vertical" and "horizontal" as used herein are generally perpendicular directions relative one another independent of orientation of the substrate in three-dimensional space. Further in this document, "elevational", "upper", "lower", "top", and "bottom" are with reference to the vertical direction. Regardless, example thicknesses for first electrode 12, tunnel insulator material 16, and second electrode 14 are about 5 to 200 Angstroms, about 5 to 50 Angstroms, and about 20 to 300 Angstroms, respectively. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials described herein may be of substantially constant thickness or of variable thicknesses. If of variable thickness, thickness refers to average thickness unless otherwise indicated.

Any suitable composition or combination of compositions may be used for tunnel insulator material 16 and first electrode 12. Tunnel insulator material 16 may, for example, comprise, consist essentially of, or consist of one or more of $MgO$, $TiO_x$, and $AlO_x$ (where "x" is a number). Magnetic recording material of first electrode 12 may, for example, comprise, consist essentially of, or consist of one or both of cobalt and iron; and may further comprise additional metals/materials (e.g., boron).

The reference material of second electrode 14 comprises an iridium-containing region 18 between a polarizer region 20 and a magnetic multi-material (e.g., multi-layer) stack 22. The region 18 may be the only iridium-containing region in the reference material.

The polarizer region is configured to be spin-polarized in a desired orientation, and the remainder of the reference material is configured to maintain (i.e., pin) such desired spin orientation within the polarizer region. The polarizer region may comprise any suitable composition or combination of compositions. In some embodiments, an uppermost portion 24 of the polarizer region (i.e., a portion of the polarizer region directly adjacent the tunnel insulator 16) will comprise cobalt and/or iron; and such may further comprise one or more of B, Ta, W, Re and Mo. For instance, in some embodiments the uppermost portion 24 of the polarizer region may comprise $Co_xFe_yB_z$; where x and y are each 10-80 and z is 0-50. The boron concentration may be tuned to achieve desired magnetic and crystalline properties for specific applications. The thickness of portion 24 may be tailored to achieve a total dipole of near zero.

The polarizer region may optionally comprise additional materials besides the illustrated material of uppermost portion 24; and such optional additional materials are diagrammatically illustrated utilizing an illustrated space between the uppermost region 24 and the iridium-containing region 18.

The iridium-containing region 18 may comprise, consist essentially of, or consist of iridium. In some embodiments, the iridium-containing region 18 consists of only pure iridium. In other embodiments, the iridium-containing region 18 may comprise one or more dopants and/or other materials in combination with the iridium. Such dopants and/or other materials may tailor chemical and/or physical properties of the iridium-containing region for particular applications.

The iridium-containing region 18 may have any suitable thickness, and in some embodiments may have a thickness within a range of from about 2 angstroms (Å) to about 20 Å such as, for example, a range of from about 4 Å to about 8 Å. In some embodiments, the iridium-containing region may consist of iridium throughout an entirety of the thickness of such region. In other embodiments, dopants and/or other materials may be provided within at least some portion of the thickness of the iridium-containing region.

The stack 22 may comprise any suitable materials. In the illustrated embodiment, the stack 22 comprises cobalt alternating with one or more of platinum, palladium and nickel. Specifically, the stack comprises cobalt-containing layers alternating with other layers that comprise one or more of platinum, palladium and nickel. In some embodiments, the cobalt-containing layers may comprise, consist essentially of, or consist of elemental cobalt or a cobalt-rich alloy. The term "cobalt-rich alloy" means an alloy in which cobalt is the greatest quantity element of all elements considered in total on an atomic/molar basis. Example cobalt-rich alloys include CoFeB and CoM (where M may be, for example, one or more of Ta, Ti, W, Mg, Ru, etc.). In some embodiments, the layers that comprise one or more of platinum, palladium and nickel may comprise, consist essentially of, or consist of elemental Pt, Pd and/or Ni; or may comprise, consist essentially of, or consist of an alloy comprising more than 50 atomic percent Pt, Pd and/or Ni.

The cobalt-containing layers within stack 22 may have any suitable thicknesses, and in some embodiments may have thicknesses within a range of from about 1 Å to about 10 Å. Similarly, the layers within stack 22 that comprise one or more of platinum, palladium and nickel may have any suitable thicknesses, and in some embodiments may have thicknesses within a range of from about 1 Å to about 10 Å.

The composition, thickness and total number of the layers within stack 22 may be tailored to achieve desired pinned spin-orientation stability. In some embodiments, the stack may comprise a "superlattice", or in other words each layer may be about 1 monolayer thick.

The illustrated stack 22 is an example embodiment multilayer stack; and in other embodiments other stacks may be utilized. For instance, in some embodiments the stack 22 may comprise iron-containing layers alternating with other layers instead of comprising cobalt-containing layers alternating with other layers.

A region of the reference material is diagrammatically illustrated to extend beneath the stack 22 to indicate that there may be other structures within the reference material besides the illustrated stack 22. Such other structures may include, for example, seed material utilized for inducing a desired crystalline lattice into a composition of the reference material, etc.

In some embodiments, the stack 22 may be considered to be a first region of reference material 14, the iridium-containing region 18 may be considered to be a second region of the reference material, and the cobalt-and-iron-containing region 24 may be considered to be a third region of the reference material. Such first, second and third regions 22, 18 and 24 may be the only regions within the reference material in some embodiments. In other embodiments the first, second and third regions 22, 18 and 24 may be utilized in combination with other regions (an example embodiment comprising other regions in addition to the regions 22, 18 and 24 is described below with reference to FIG. 2).

In some embodiments, the stack 22 and iridium-containing region 18 may have a first crystalline lattice corresponding to face centered cubic (fcc) 111. In such embodiments, the portion 24 of the polarizer region, together with the tunnel insulator 16, may have a second crystalline lattice corresponding to body centered cubic (bcc) 001.

The stack 22 may provide desired magnetic properties for pinning the polarized spin of the polarizer region in a desired orientation, and the iridium-containing region may provide desired stable coupling between the magnetic material of stack 22 and the material within the polarizer region. Incorporation of one or more of Pt, Pd and Ni within stack 22 may enable the stack to have a smoother (i.e., less rough) upper surface than is achieved if other materials (for instance, iridium) are incorporated into stack 22. The smooth upper surface of the stack may be desirable to achieve a uniform deposition of materials of magnetic tunnel junction 10 over the stack and/or to achieve uniform crystallographic lattices throughout materials within the stack and over the stack.

Figure 2:
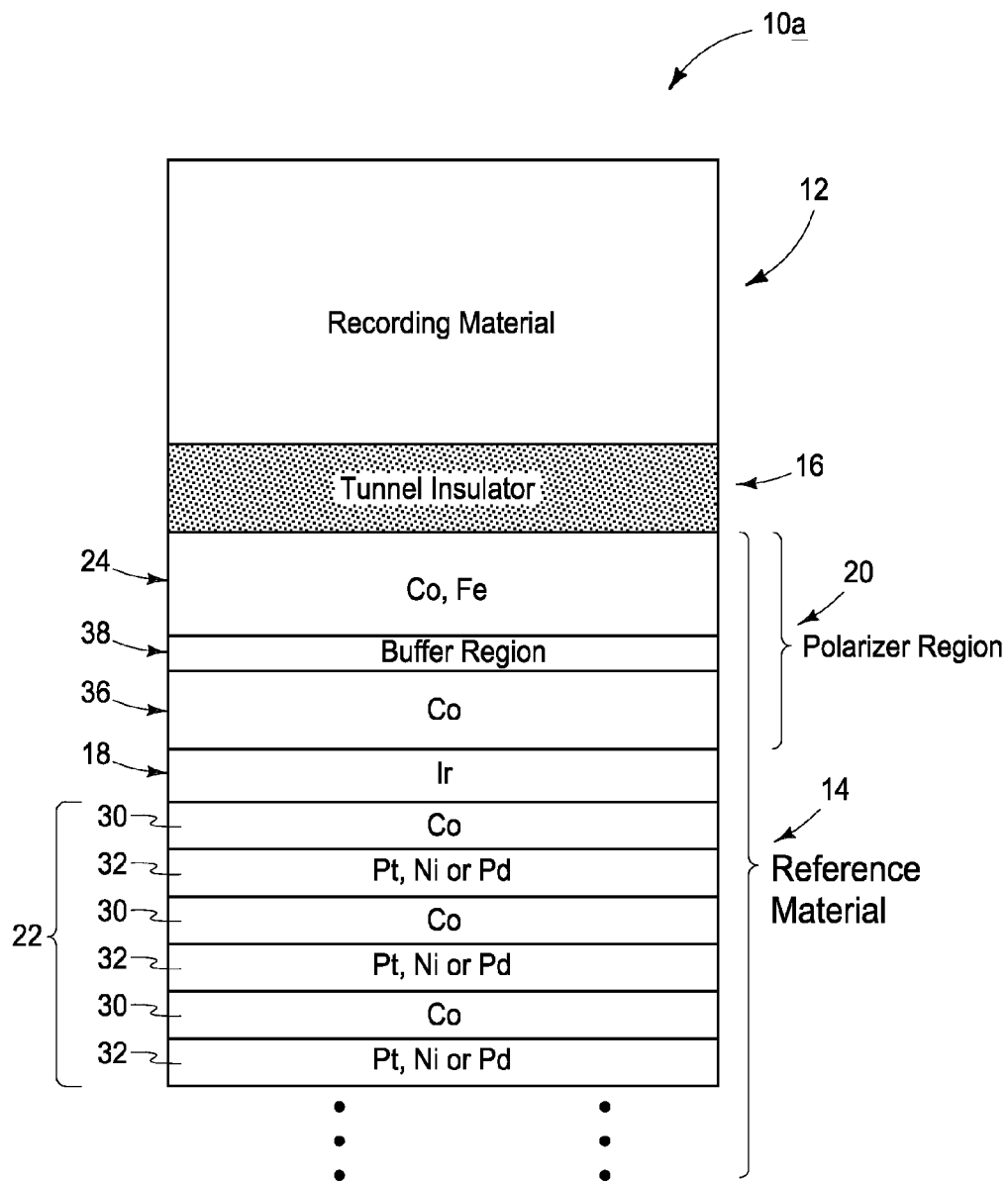

FIG. 2 shows another embodiment magnetic tunnel junction 10a. The magnetic tunnel junction 10a comprises a first electrode 12 comprising recording material, and a tunnel insulator 16; analogous to the first electrode and tunnel insulator discussed above with reference to FIG. 1.

The stack 22 of FIG. 2 is shown to comprise alternating first and second layers 30 and 32; with the first layers comprising, consisting essentially of, or consisting of Co, and the second layers comprising, consisting essentially of, or consisting of Pt, Pd and/or Ni.

The iridium-containing region 18 is over the stack 22, and the polarizer region 20 is over the region 18.

In the shown embodiment, the polarizer region 20 comprises a cobalt-containing material 36 directly against the iridium-containing region 18. The cobalt-containing material 36 may comprise, consist essentially of, or consist of cobalt. An advantage of utilizing cobalt-containing material 36 can be that the cobalt-containing material has good adhesion to the iridium-containing material of region 18. In this context, the "adhesion" may be magnetic adhesion, meaning that there is enhanced coupling strength through the iridium.

A buffer region 38 is over material 36, and the cobalt-and-iron-containing region 24 is over the buffer region. The buffer region 38 may comprise substantially amorphous buffer material; and may, for example, comprise, consist essentially of, or consist of one or more of tantalum, ruthenium, tungsten, molybdenum, etc. The buffer region may have a thickness of, for example, from about 1 Å to about 5 Å. The buffer region may be utilized as a bridge between a first crystalline lattice beneath the buffer region and a second crystalline lattice above the buffer region. For instance, the cobalt-containing adhesion material 36 may have the fcc 111 lattice of the underlying iridium-containing region, and the cobalt-and-iron-containing region 24 may have a bcc 001 lattice. In some embodiments, the buffer region may be omitted, and a bcc lattice may be formed directly against an fcc lattice. The thickness of the buffer layer may be tuned for magnetoresistance. The composition of the buffer layer may be tuned to inhibit crystallization of cobalt-and-iron-containing region 24 until after deposition of tunnel insulator 16 (e.g., the buffer layer may comprise one or more of Ta, Mo, etc.).

In some embodiments, the polarizer region 20 may have a total thickness of from about 4 Å to about 25 Å; the iridium-containing region 18 may have a total thickness of from about 2 Å to about 20 Å; and the stack 22 may have a total thickness of from about 20 Å to about 200 Å. The stack 22 may have high perpendicular magnetic anisotropy. The iridium-containing region 18 may also have high perpendicular magnetic anisotropy, and further may be a barrier to diffusion of materials from stack 22 into polarizer region 20 and vice versa.

The magnetic tunnel junctions discussed above may be utilized in memory products or specific memory technologies (e.g., MRAM. STT-MRAM, etc.), or in other technologies (e.g., logic, sensors, oscillators, etc.). The magnetic tunnel junctions may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Some embodiments include a magnetic tunnel junction comprising magnetic reference material having an iridium-containing region between a multi-layer stack and a polarizer region.

Some embodiments include a magnetic tunnel junction having a conductive first magnetic electrode which contains magnetic recording material, a conductive second magnetic electrode spaced from the first electrode and which contains magnetic reference material, and a non-magnetic insulator material between the first and second electrodes. The magnetic reference material of the second electrode includes an iridium-containing material over a stack comprising Co and one or more of platinum, palladium and nickel. The magnetic reference material includes a cobalt-and-iron-containing material over the iridium-containing material and directly against the non-magnetic insulator material. The iridium-containing material and the stack have a first crystalline lattice, and the non-magnetic insulator material and the cobalt-and-iron-containing material have a second crystalline lattice which is different from the first crystalline lattice. A buffer region is between the iridium-containing material and the cobalt-and-iron-containing material.

Some embodiments include a magnetic tunnel junction having a conductive first magnetic electrode which contains magnetic recording material, a conductive second magnetic electrode spaced from the first electrode and which contains magnetic reference material, and a non-magnetic insulator material between the first and second electrodes. The magnetic reference material of the second electrode includes a stack of alternating first and second layers. The first layers comprise cobalt and the second layers comprise one or more of Pt, Pd and Ni. The magnetic reference material of the second electrode comprises an iridium-containing region over the stack. The magnetic reference material of the second electrode comprises a polarized region between the iridium-containing region and the non-magnetic insulator material. The polarized region includes a material comprising cobalt and iron.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A magnetic tunnel junction, comprising:
    a conductive first magnetic electrode comprising magnetic recording material;
    a conductive second magnetic electrode spaced from the first electrode and comprising magnetic reference material;
    a non-magnetic insulator material between the first and second electrodes;
    the magnetic reference material of the second electrode comprising an iridium-containing material over a stack comprising Co and one or more of platinum, palladium and nickel;
    the magnetic reference material of the second electrode comprising a polarizer region over the iridium-containing region, the polarizer region containing a cobalt material consisting essentially of cobalt, a cobalt-and-iron-containing material directly against the non-magnetic insulator material and an amorphous buffer region between the cobalt material and the cobalt-and-iron-containing material; and
    wherein the iridium-containing material and the stack have a first crystalline lattice, and the non-magnetic insulator material and the cobalt-and-iron-containing material have a second crystalline lattice which is different from the first crystalline lattice.

2. The magnetic tunnel junction of claim 1 wherein the iridium-containing material has a thickness within a range of from about 2 Å to about 20 Å.

3. The magnetic tunnel junction of claim 1 wherein the iridium-containing material has a thickness within a range of from about 4 Å to about 8 Å.

4. The magnetic tunnel junction of claim 1 wherein the first crystalline lattice is face centered cubic (fcc) 111; and wherein the second crystalline lattice is body centered cubic (bcc) 001.

5. The magnetic tunnel junction of claim 1 wherein the buffer region consists of one or more of tantalum, ruthenium, tungsten, molybdenum.

6. The magnetic tunnel junction of claim 1 wherein the buffer region consists of tantalum.

7. The magnetic tunnel junction of claim 1 wherein the cobalt-and-iron-containing material further comprises one or more of B, Ta, W, Re and Mo.

8. The magnetic tunnel junction of claim 1 wherein the cobalt-containing material consists of cobalt.

9. The magnetic tunnel junction of claim 1 wherein the cobalt-containing adhesion material has the first crystalline lattice.

10. A magnetic tunnel junction, comprising:
    a conductive first magnetic electrode comprising magnetic recording material;
    a conductive second magnetic electrode spaced from the first electrode and comprising magnetic reference material;
    a non-magnetic insulator material between the first and second electrodes;
    the magnetic reference material of the second electrode comprising a stack of alternating first and second layers; the first layers comprising cobalt and the second layers comprising one or more of Pt, Pd and Ni;
    the magnetic reference material of the second electrode comprising an iridium-containing region over the stack; and
    the magnetic reference material of the second electrode comprising a polarized region between the iridium-containing region and the non-magnetic insulator material; the polarized region including a material comprising cobalt and iron, a material consisting of cobalt, and a buffer region disposed between the material consisting of cobalt and the material comprising cobalt and iron; and
    wherein:
        the iridium-containing region consists of iridium;
        the material consisting of cobalt is directly against the iridium-containing region, the material consisting of cobalt and the iridium-containing region having a first crystalline lattice;
        and
        the material comprising cobalt and iron of the polarized region being over the buffer material and comprising a second crystalline lattice which is different from the first crystalline lattice.

11. The magnetic tunnel junction of claim 10 wherein the buffer region comprises one or more of tantalum, ruthenium, tungsten and molybdenum.

12. The magnetic tunnel junction of claim 11 wherein the buffer region has a thickness of from about 1 Å to about 5 Å.

13. The magnetic tunnel junction of claim 1 wherein the buffer region has a thickness of from about 1 Å to about 5 Å.

* * * * *